United States Patent
Saia et al.

(10) Patent No.: US 8,604,612 B2
(45) Date of Patent: Dec. 10, 2013

(54) CHIP ATTACH ADHESIVE TO FACILITATE EMBEDDED CHIP BUILD UP AND RELATED SYSTEMS AND METHODS

(75) Inventors: Richard Joseph Saia, Niskayuna, NY (US); Thomas Bert Gorczyca, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 487 days.

(21) Appl. No.: 12/389,060

(22) Filed: Feb. 19, 2009

(65) Prior Publication Data

US 2010/0207261 A1 Aug. 19, 2010

(51) Int. Cl.
*H01L 23/12* (2006.01)
*H01L 21/58* (2006.01)
*C09J 163/00* (2006.01)
*C08G 59/68* (2006.01)

(52) U.S. Cl.
USPC ............. 257/729; 438/118; 522/25; 522/28; 522/31; 523/460

(58) Field of Classification Search
None
See application file for complete search history.

(56) References Cited

U.S. PATENT DOCUMENTS

| | | | | |
|---|---|---|---|---|
| 3,779,988 A | * | 12/1973 | Rembold et al. | 528/25 |
| 5,089,440 A | * | 2/1992 | Christie et al. | 29/841 |
| 5,169,911 A | | 12/1992 | Lupinski et al. | |
| 5,547,713 A | * | 8/1996 | Alvarado | 427/493 |
| 5,654,081 A | * | 8/1997 | Todd | 428/209 |
| 5,691,395 A | | 11/1997 | Knudsen et al. | |
| 5,863,970 A | * | 1/1999 | Ghoshal et al. | 523/434 |
| 6,084,004 A | | 7/2000 | Weinmann et al. | |
| 6,255,137 B1 | | 7/2001 | Gorczyca et al. | |
| 7,632,425 B1 | * | 12/2009 | Simone et al. | 252/182.3 |
| 2005/0228079 A1 | * | 10/2005 | Fujiki et al. | 523/402 |
| 2007/0213429 A1 | * | 9/2007 | Cheng et al. | 523/458 |
| 2008/0164597 A1 | * | 7/2008 | Hsu et al. | 257/690 |
| 2008/0318413 A1 | * | 12/2008 | Fillion et al. | 438/637 |

FOREIGN PATENT DOCUMENTS

| | | |
|---|---|---|
| EP | 1008640 B1 | 7/2004 |
| JP | 64051422 | 2/1989 |
| WO | WO 2007087399 A1 * | 8/2007 |

OTHER PUBLICATIONS

Product Data Sheet for Irganox 1010, provided by Ciba Specialty Chemicals (Aug. 1998).*
Product Data Sheet for K-Pure CXC-1612, provided by King Industries (Feb. 2006).*
Lewis, S. et al., "Reliability Testing of Advanced Semiconductors using Embedded Chip Build-Up (EBCU) Packaging Technology", SMTA International 2008, Orlando, FL., Aug. 17-21, 2008.

* cited by examiner

*Primary Examiner* — Michael J Feely
(74) *Attorney, Agent, or Firm* — Jean Testa; Fletcher Yoder

(57) ABSTRACT

Present embodiments are directed to an adhesive and method for assembling a chip package. The adhesive may be used to couple a chip to a substrate, and the adhesive may include an epoxy-based dielectric material, an epoxy resin, a photoacid generator, an antioxidant, and a cold catalyst corresponding to the photoacid generator.

13 Claims, 2 Drawing Sheets

CHIP ATTACH ADHESIVE TO FACILITATE EMBEDDED CHIP BUILD UP AND RELATED SYSTEMS AND METHODS

BACKGROUND OF THE INVENTION

The present disclosure relates generally to an adhesive that may be optimized for use in an embedded chip build up (ECBU) process. More particularly, present embodiments are directed to a photosensitive, thermoset adhesive that includes compositional features that facilitate successful build up of a module, establish final product reliability, and establish yield of an ECBU process.

Flip chip packaging may be defined as the direct electrical connection of face-down electronic components onto substrates, circuit boards, or carriers. For example, in a typical flip chip packaging procedure, the active side of a chip may be coupled to a substrate. This is in contrast to other techniques for chip packaging connection, such as wire bonding, wherein face-up chips are typically connected to each of various pads on the substrate using bond wire. The ECBU process may be categorized as a flip chip packaging procedure.

Flip chip packaging connections are generally considered to have numerous advantages over other techniques in performance, reliability, and versatility. However, there are also numerous challenges associated with traditional flip chip packaging. For example, the planarity of substrates and bump volume may be a limiting factor in successful and repeatable flip chip bonding of the type wherein each bump is required to contact a pad prior to reflow or thermo-compression bonding. Some of these challenges have been addressed by the ECBU process, wherein solder bump or wirebond interconnects may be eliminated by the use of a specialized material set and micro-via technology. The ECBU process generally includes attaching the active side of a chip to a substrate via adhesive and then drilling through the substrate and the adhesive to access bond pads on the active side of the die. It is now recognized that certain aspects of the adhesive may be substantially optimized to efficiently accommodate certain aspects of the ECBU process.

BRIEF DESCRIPTION OF THE DRAWINGS

Advantages of the present embodiment may become apparent upon reading the following detailed description and upon reference to the drawings in which.

DETAILED DESCRIPTION OF SPECIFIC EMBODIMENTS

One or more specific embodiments of the present invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The embedded chip build up (ECBU) process utilizes a chip attach adhesive to couple chips and other components with a substrate, such as a polyimide flex circuit board, early in the fabrication process. Present embodiments relate to an adhesive with compositional properties that facilitate ECBU product reliability and yield. For example, present embodiments include adhesive features that may limit corrosion of metals during certain procedures, facilitate curing of areas of the adhesive that may be covered by certain components (e.g., a chip), limit embrittlement of the adhesive during curing, and so forth.

Figure 1:
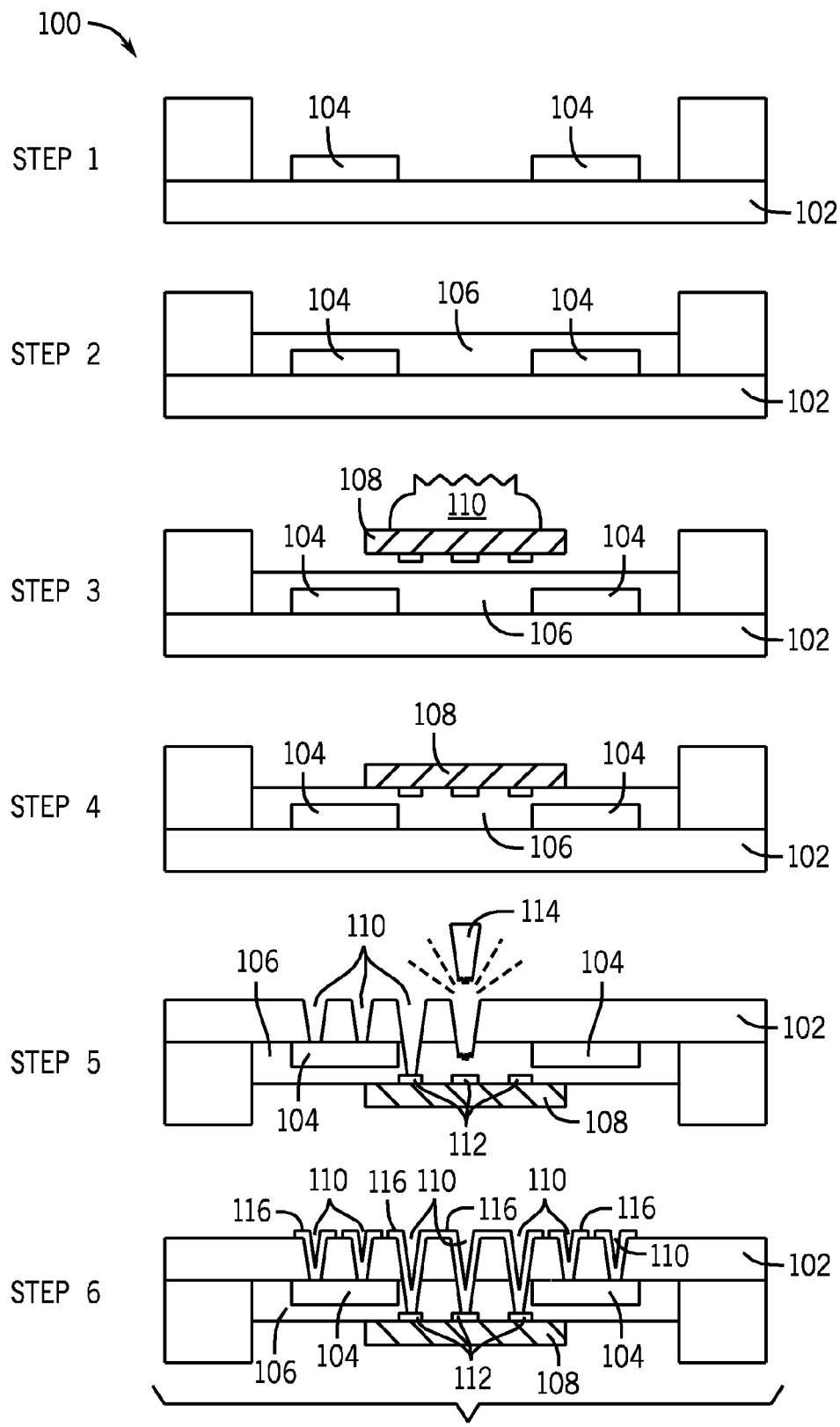
FIG. 1 illustrates an ECBU process that utilizes an adhesive in accordance with present embodiments.

FIG. 1 illustrates process flow steps and the associated cross-sectional views of a single chip carrier module as it goes through the process flow of an ECBU procedure in accordance with present embodiments. The process is generally indicated by reference numeral 100. Each cross-sectional view represents one or more steps in the process 100. Specifically, in the illustrated embodiment, six steps are shown and respectively indicated as Step 1, Step 2, Step 3, Step 4, Step 5, and Step 6. It should be noted that some steps include multiple procedures. Further, as would be understood by one of ordinary skill in the art, additional steps could be illustrated and/or performed.

The process 100 begins in Step 1 with metallization and patterning of a substrate 102. For example, the features of the substrate 102 illustrated by the cross-section in Step 1 may be provided by sputtering Ti/Cu, electroplating Cu, and/or sputtering Ti onto a film (e.g., a polymer film), and then patterning and etching the disposed layers to define substrate features 104. In other embodiments, different layers and/or procedures may be utilized in preparation of the substrate 102 and different features may be included on the substrate. In Step 2, the metallized side of the substrate 102 may be coated with an adhesive 106 (e.g., a 12-25 μm thick film of adhesive), which may include compositional features in accordance with present embodiments. As illustrated by Step 3, a chip 108 may be attached to the adhesive 106 in a face down orientation using a die attach mechanism 110 or some similar procedure. It should be noted that in some embodiments, the adhesive 106 may be coated on either side of the substrate 102 and the chip 108 or multiple chips may be subsequently attached thereto, and/or the flex could have been previously metalized and patterned on both sides.

The adhesive 106 may then be cured with the chip 108 in place, as illustrated by Step 4. For example, Step 4 may include bonding the chip 108 to the adhesive 106 by thermal curing of the adhesive using a vacuum pressure lamination process. Curing the adhesive may include various process steps including: (1) placing the substrate 102 in a nitrogen purged autoclave, (2) pressurizing it with nitrogen to 70 psi, (3) heating to 125° C., (4) holding for one hour, (5) ramping the temperature to 220° C. while reducing the pressure to 10 psi, and (6) holding for two hours. Parts may then be cooled under vacuum to a temperature less than 100° C. prior to unloading from the chamber. This may conclude the procedures preformed prior to flipping the substrate 102 to access the other side.

Once the chip 108 has been secured to one side of the substrate 102 with the adhesive 106 and/or the curing procedure, the process 100 may proceed to Step 5, which may include flipping the substrate 102 and forming micro-vias 110 to access chip pads 112 and/or metallized portions of the substrate 102 (e.g., the substrate features 104). For example, the micro-vias 110 may be drilled through the substrate 102 and the cured adhesive 106 using a UV laser 114 to access the chip pads 112 and/or the metallized substrate features 104. Once the vias 110 have been formed, the vias 110 and the side of the substrate 102 opposite the chip 108 may be metallized to form features 116, as indicated by Step 6. For example, metallization may be performed using a combined sputter-electroplate process, and a pattern and etching process. Specifically, for example, this may include sputtering Ti/Cu, electroplating Cu, sputtering Ti, and then using a photo-pattern resist with a standard subtractive or semi-additive plating process. This may complete a first build-up layer. Subsequent layers may be added in accordance with present embodiments.

Embodiments of the present disclosure relate to the nature of the adhesive 106. Specifically, one embodiment relates to the adhesive 106 having certain compositional components that provide certain functionality. It should be noted that present embodiments may include commercially available products as compositional components. For example, a material often used in traditional ECBU processes consists of XP9500, a photo-imagable dielectric material blended with CY184 liquid epoxy resin. XP9500 is a product of Rohm and Haas©, which has corporate headquarters at 100 Independence Mall West, Philadelphia, Pa., 19106, USA. Present embodiments may incorporate a modified version of XP9500 referred to as XP080702, which is also a product of Rohm and Haas©. XP080702 may have essentially the same compositional features as XP9500. However, in contrast to XP9500, XP080702 may not include any photoacid generator (PAG). Thus, XP080702 may be referred to as an epoxy-based dielectric material. Additional components of the adhesive 106 are discussed in detail below.

In accordance with present embodiments, the adhesive 106 may include certain qualities that facilitate the process described by Steps 1-6. Specifically, it is now recognized that the use of a chip attach adhesive that meets certain critical to quality standards (CTQs) will facilitate providing a reliable ECBU product. For example, the adhesive may provide surface tackiness after coating and solvent removal to limit or minimize movement of components (e.g., the chip 108) placed on the adhesive 106 relative to other chips and/or components and metalized layers on the substrate 102. Further, the adhesive 106 may also include a mechanism to reduce and/or eliminate surface tackiness in field areas (e.g., areas surrounding attached components) to facilitate processing. For example, limiting tackiness may be desirable to facilitate processing a part with a vacuum lamination cycle at low temperatures to eliminate voids, while not adhering to overlaid (blotter) films used to press surface components into the adhesive.

In accordance with existing ECBU procedures, after a chip is attached to a substrate, exposure of the adhesive to ultraviolet (UV) light may be utilized to cure the exposed adhesive enough to limit or minimize its tackiness. Specifically, the UV light may activate PAG in field areas of the adhesive to initiate such curing. However, it is now recognized that components placed on the adhesive prior to this UV exposure may substantially block the UV light from reaching the adhesive, and, thus, block activation of the PAG underneath the components. This reduces the cure in these critical areas. Accordingly, present embodiments are directed to an adhesive that includes a thermal epoxy catalyst to promote epoxy cure in areas with limited or no exposure to UV light, such as portions of the adhesive underneath a die. For example, present embodiments may include an adhesive with a PAG (e.g., Octacat) and a cold catalyst (e.g., Copper Naphthenate) as compositional components, wherein the cold catalyst makes the PAG thermally liable. Further, present embodiments may include compositional components such as a thermal acid generator (TAG) (e.g., CXC1612, which may be available from King Industries), and/or polyols and anhydrides that promote epoxy cure.

The adhesive utilized in accordance with present embodiments may include a composition that is modified relative to XP9500. For example, in present embodiments, the adhesive may have an amount of PAG that is 50% to 70% less than that present in the XP9500 to reduce and/or avoid corrosion. Indeed, it is now recognized that certain levels of PAG, such as that found in XP9500, may cause metal corrosion during testing procedures. For example, certain levels of PAG may cause substantial corrosion of aluminum during highly accelerated stress testing (HAST) (85% RH, 130° C.). This has been demonstrated by testing, as indicated by the data set forth in Table I below:

TABLE I

| Sample | XP9500 | XP080702 | CY184 | ERL4221 | Octacat | Results |
|---|---|---|---|---|---|---|
| 1 | 100 gr | — | 11 gr | — | — | Corrosion seen |
| 2 | 50 gr | 50 gr | 11 gr | — | — | Corrosion seen |
| 3 | — | 100 gr | 11 gr | — | 0.35 gr | No corrosion |
| 4 | — | 100 gr | — | 11 gr | 0.35 gr | No corrosion |

Including limited levels of PAG in the adhesive has been shown to essentially eliminate metal corrosion during an accelerated water boil test. Accordingly, present embodiments are directed to limiting the amount of PAG in the adhesive to prevent or limit corrosion. The amount of PAG may be limited to what is desirable or necessary to reduce the film surface tackiness to a desirable level after exposure to UV light. It should be noted that, in present embodiments, curing the film through its entire thickness such that it can withstand development steps for which the original XP9500 was designed is not an issue. Accordingly, the use of less PAG is appropriate.

Additionally, certain types of PAG may be utilized to avoid corrosiveness. For example, the type of PAG employed in present embodiments may have limited acid strength that is sufficient to reduce a film's surface tackiness when exposed to UV light. Low levels of Octacat have been demonstrated to result in minimal corrosion. Further, Octacat in the presence of Copper Naphthenate may operate as a thermal epoxy catalyst. Octacat is a product of Momentive Performance Materials, which has head quarters at 22 Corporate Woods Boulevard, Albany, N.Y. 12211, USA.

Turning again to the qualities of the adhesive 106, it may be desirable for the adhesive 106 to facilitate its ablation during the forming of the vias 110 in the ECBU process. For example, after curing, it may be desirable for the adhesive 106 to have sufficient absorption properties at a wavelength used for laser via formation to limit damage to the underlying bond pads 112 (e.g., aluminum bond pads) on the chip 108. A typical wavelength value is near 351 nm with the use of laser drilling techniques to form the vias 110. However, it is now recognized that due to the limited amounts of PAG utilized in the adhesive 106 in accordance with present embodiments, the absorption of the adhesive 106 at or around 351 nm may be limited to the point that it is difficult to ablate. Accordingly, present embodiments may incorporate photo sensitizers and/or dyes to promote laser ablation through the adhesive 106 at minimal power. For example, including or increasing an amount of photo sensitizer (e.g., dimethoxyanthracene) may promote adhesive cure and subsequent reduced surface tackiness at lower PAG concentrations. Additionally, incorporation of anthracene should improve laser ablation because it absorbs strongly near 351 nm.

Due to the limited amount of PAG and the UV blocking underneath components (e.g., the chip 108) attached to the adhesive 106, a high temperature curing step may be desirable to properly cure the adhesive 106. However, it is now recognized that such high temperature curing can cause embrittlement of the film formed by the adhesive 106. Embrittled adhesive may become cracked during expansion, causing excessive expansion of the polyimide film in the cracked areas, which may cause breaks in features of the substrate 102, such as metal traces. Accordingly, present embodiments may limit embrittlement by reducing cure temperature by incorporating suitable curing catalysts as described above. Further, present embodiments may eliminate oxygen in the ambient during cure and/or incorporate an antioxidant to limit or prevent both oxidation of metals (e.g., aluminum) and embrittlement of the adhesive 106 during cure and subsequent processing. This may include incorporation of antioxidants such as Ciba® IRGANOX®, a phenolic based material that hinders thermally induced oxidation of polymers at high temperatures. Incorporating antioxidants may facilitate maintaining flexibility of the material and minimize oxidation of aluminum during cure. Antioxidants have been demonstrated to prevent thermal degradation in polymer systems.

In addition to the inclusion of specified material components in the adhesive 106, present embodiments may include several processing steps to limit oxygen and moisture incorporation in the vias 110 at the metal contact region (e.g., the aluminum/sputtered metal contact region). Indeed, it is now recognized that both adhesive and polyimide films utilized in accordance with present embodiments may be hygroscopic. In other words, adhesive and polyimide films that may be utilized in accordance with present embodiments typically take up and retain moisture. Accordingly, present embodiments may take precautions to minimize moisture content during certain process steps (e.g., plasma clean, metal sputter, and bake steps) to avoid oxygen incorporation and/or oxidation at exposed metal surfaces (e.g., exposed aluminum). For example, present embodiments may include removal of substantially all moisture in the polyimide and adhesive films prior to both laser desoot (reactive ion etch) and metal sputter. Further, removal of the moisture may be achieved in a way which minimizes aluminum oxidation.

Specifically, oxygen incorporation at an aluminum/sputtered via metal interface may be limited or minimized by baking out the dielectric films prior to via desoot and metallization. After via desoot, any moisture absorption by the dielectrics may be removed at low temperature (e.g., approximately 40° C. or less) under vacuum. It has been determined that aluminum exposed to CF4/O2 desoot chemistry leaves the metal in an "activated" state, making it much more susceptible to oxidation from moisture than it would have been if it had not been exposed. Removal of moisture from the dielectrics at elevated temperatures, i.e., greater than 100° C. can cause enhanced oxidation of the aluminum. Lowering the bake temperature to approximately less than 90° C. limits the aluminum oxidation.

Present embodiments may include an adhesive with certain compositional features. For example, the adhesive may include certain materials that are mixed in proportion to one another. Table II, as set forth below, includes a range of compositions in accordance with present embodiments, wherein the amount of each compositional component is expressed by weight (e.g., grams) relative to the other components. Present embodiments may include compositions with values approximately the same as the values set forth in Table II.

TABLE II

| Material | Examples | Amount |
| --- | --- | --- |
| Epoxy-Based Dielectric | XP080702 | 100.0 +/− 0 |
| Epoxy Resin | CY184, ERL4221, ERL4299 and/or blends | 11.0 +/− 5 |
| PAG | Octacat | 0.35 +/− 0.25 |
| Photosensitizer | Isopropylthioxanthone | 0.5 +/− 0.5 |
| Photosensitizer | 2-ethyl-9,10-dimethoxyanthracene | 0.4 +/− 0.4 |
| Antioxidant | Irganox 1010 ® | 0.0 +/− 1.0 |
| Cold Catalyst | Copper Naphthenate | 0.0 +/− 0.1 |
| Thermal Catalyst | CXC1612 | 0.0 +/− 0.5 |

Figure 2:
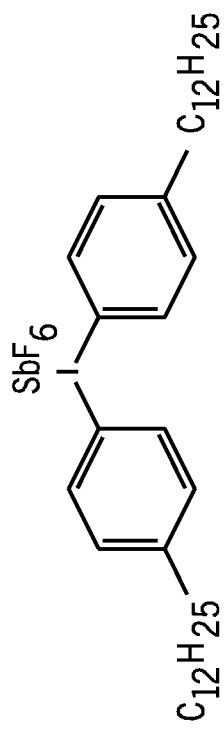
FIG. 2 illustrates various chemical structures that may be utilized as compositional components of an adhesive in accordance with present embodiments.
Figure 2:
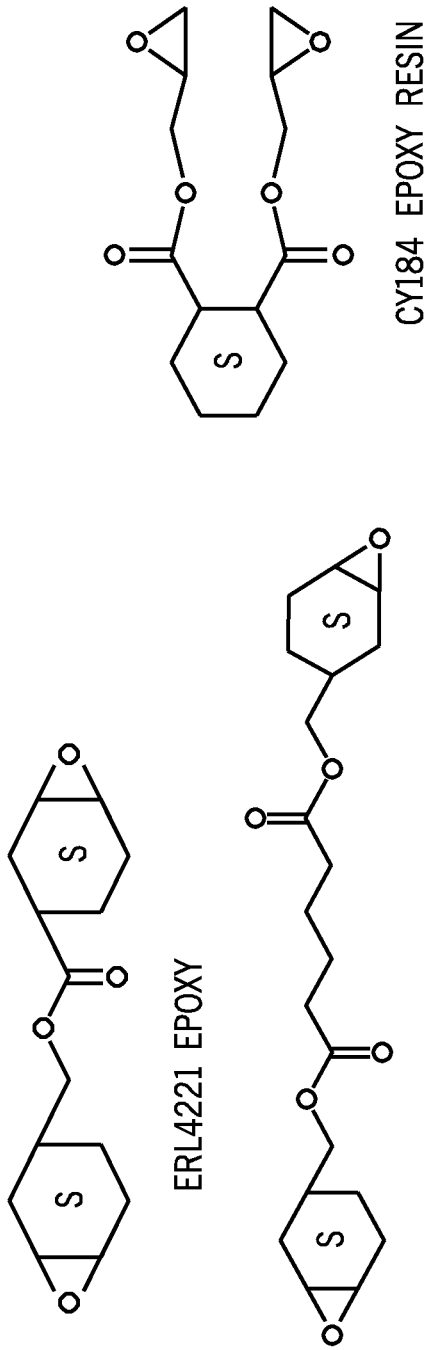

FIG. 2 illustrates the chemical structure of some of the components of the adhesive listed in Table II. Specifically, FIG. 2 illustrates Octacat, ERL4221, ERL4299, and CY184. It should be noted that Octacat is used as an example of a PAG that does not accumulate and is less extractable than the PAG utilized in XP9500. Further, it should be noted that copper naphthenate is a cold catalyst that is unique to Octacat. With regard to other components of the adhesive listed in Table II, Irganox 1010 is available from Ciba®, which is headquartered in Basel, Switzerland, and CXC1612 is available from King Industries, which is headquartered at Science Road, Norwalk Conn. 06852, USA. Isopropylthioxanthone and 2-ethyl-9,10-dimethoxyanthracene are photosensitizers available from Aldrich Chemical Company, which have strong absorption near the laser wavelengths used for via formation.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A flip chip attach adhesive, comprising:
   100 parts by weight of an epoxy-based dielectric material that does not include any photoacid generator;
   6 to 16 parts by weight of an epoxy resin selected from the group consisting of diglycidyl 1,2-cyclohexanedicarboxylate, bis(3,4-epoxycyclohexylmethyl)adipate, 3,4-epoxycyclohexylmethyl 3,4-epoxycyclohexanecarboxylate, and blends thereof;
   0.1 to 0.6 parts by weight of a bis(4-alkylphenyl)iodonium hexafluoroantimonate photoacid generator; and
   a positive amount of up to 0.1 part by weight of copper naphthenate cold catalyst, allowing the photoacid generator to operate as a thermal epoxy catalyst.

2. The flip chip attach adhesive of claim 1, further comprising: a positive amount of up to 1 part by weight of an antioxidant; and a positive amount of up to 1.8 parts by weight of photosensitizer to promote laser ablation through the adhesive.

3. The flip chip attach adhesive of claim 2, wherein the antioxidant is Pentaerythritol Tetrakis(3-(3,5-di-tert-butyl-4-hydroxyphenyl)propionate).

4. The flip chip attach adhesive of claim 2, wherein the photosensitizer is selected from the group consisting of iso propylthioxanthone, anthracene, dimethoxyanthracene, 2-ethyl-9,10-dimethoxyanthracene, and combinations thereof.

5. The flip chip attach adhesive of claim 1, wherein the epoxy-based dielectric material is photo-imagable.

6. The flip chip attach adhesive of claim 1, wherein the photoacid generator has the following formula:

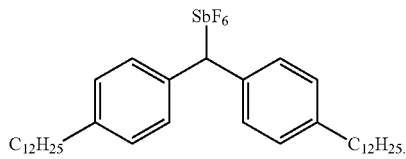

7. The flip chip attach adhesive of claim 1, wherein the composition further comprises a positive amount of up to 0.5 part by weight of a thermal acid generator.

8. A method for assembling a flip chip package, comprising:
 preparing the flip chip attach adhesive of claim 1;
 applying a layer of the adhesive on a substrate;
 coupling a chip, in a face down orientation, to the substrate via the adhesive;
 exposing the adhesive to ultraviolet (UV) light to limit tackiness of the adhesive; and
 thermally curing the adhesive at a curing temperature that limits embrittlement of the adhesive.

9. The method of claim 8, further comprising drilling vias through the substrate and the cured adhesive.

10. The method of claim 9, further comprising metallizing the vias.

11. The method of claim 9, further comprising removing moisture from the flip chip package by baking.

12. The method of claim 8, further comprising flipping the substrate such that the chip is in a face up orientation.

13. A flip chip package produced by the method of claim 8.

* * * * *